(12) United States Patent
Kremerman et al.

(10) Patent No.: US 8,777,547 B2
(45) Date of Patent: Jul. 15, 2014

(54) SYSTEMS, APPARATUS AND METHODS FOR TRANSPORTING SUBSTRATES

(75) Inventors: Izya Kremerman, Los Gatos, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 642 days.

(21) Appl. No.: 12/684,672

(22) Filed: Jan. 8, 2010

(65) Prior Publication Data
US 2010/0178146 A1 Jul. 15, 2010

Related U.S. Application Data

(60) Provisional application No. 61/143,808, filed on Jan. 11, 2009.

(51) Int. Cl.
*B25J 9/06* (2006.01)
*B25J 9/04* (2006.01)
*H01L 21/677* (2006.01)

(52) U.S. Cl.
CPC .......... *B25J 9/042* (2013.01); *H01L 21/67742* (2013.01); *Y10S 414/135* (2013.01); *Y10S 414/141* (2013.01); *Y10S 901/15* (2013.01); *Y10S 901/21* (2013.01); *Y10S 901/29* (2013.01); *Y10S 901/16* (2013.01)
USPC ........ 414/744.5; 414/217; 414/805; 414/935; 414/941; 901/16; 901/21; 901/29; 901/15

(58) Field of Classification Search
USPC ....................... 414/217, 744.5, 805
See application file for complete search history.

(56) References Cited

U.S. PATENT DOCUMENTS

| | | | |
|---|---|---|---|
| 5,765,983 A | 6/1998 | Caveney et al. |
| 5,811,951 A | 9/1998 | Young |
| 5,993,142 A | 11/1999 | Genov et al. |
| 6,002,840 A | 12/1999 | Hofmeister |
| 6,037,733 A | 3/2000 | Genov et al. |

(Continued)

FOREIGN PATENT DOCUMENTS

| | | |
|---|---|---|
| WO | WO 97-10079 | 3/1997 |
| WO | WO 2010-080983 | 7/2010 |

OTHER PUBLICATIONS

William P. Laceky et al., U.S. Appl. No. 12/684,772, filed Jan. 8, 2010.

(Continued)

*Primary Examiner* — Scott Lowe
(74) *Attorney, Agent, or Firm* — Dugan & Dugan, PC

(57) ABSTRACT

A substrate transporting robot apparatus is disclosed which is adapted to transport a substrate to and from a chamber of an electronic device processing system. The apparatus may include an upper arm rotatable in an X-Y plane, a forearm rotatable relative to the upper arm in the X-Y plane, and a wrist member rotatable relative to the forearm in the X-Y plane, the wrist member including an end effector adapted to carry a substrate. The wrist member may be subjected to independent rotation such that various degrees of yaw may be imparted to the wrist member. In some aspects, the independent rotation is provided without a motive power device (e.g., motor) being provided on the arms or wrist member, i.e., the wrist member may be remotely driven. Systems and methods using the robot apparatus are also provided as are numerous other aspects.

11 Claims, 13 Drawing Sheets

(56) References Cited

U.S. PATENT DOCUMENTS

| | | | |
|---|---|---|---|
| 6,121,743 | A | 9/2000 | Genov et al. |
| 6,195,619 | B1 | 2/2001 | Ren |
| 6,428,266 | B1 | 8/2002 | Solomon et al. |
| 6,485,250 | B2 | 11/2002 | Hofmeister |
| 6,593,718 | B1 | 7/2003 | Yamazoe |
| 6,643,563 | B2 | 11/2003 | Hosek et al. |
| 6,669,434 | B2 | 12/2003 | Namba et al. |
| 6,673,161 | B2 | 1/2004 | Ha et al. |
| 6,737,826 | B2 | 5/2004 | Gilchrist |
| 6,960,057 | B1 | 11/2005 | Hofmeister |
| 7,086,822 | B2 | 8/2006 | Maeda |
| 7,245,989 | B2 | 7/2007 | Hosek et al. |
| 7,891,935 | B2 | 2/2011 | Kremerman |
| 8,007,218 | B2 | 8/2011 | Park et al. |
| 2002/0098072 | A1* | 7/2002 | Sundar ............. 414/744.5 |
| 2004/0131461 | A1* | 7/2004 | Momoki ............ 414/744.5 |
| 2005/0095111 | A1* | 5/2005 | Kim et al. ......... 414/744.5 |
| 2006/0177296 | A1* | 8/2006 | Wirth ............... 414/744.5 |
| 2006/0245905 | A1 | 11/2006 | Hudgens |
| 2007/0020081 | A1* | 1/2007 | Gilchrist et al. ... 414/744.5 |
| 2007/0116549 | A1 | 5/2007 | Rice et al. |
| 2007/0166135 | A1* | 7/2007 | Koike .................. 414/217 |
| 2007/0209593 | A1* | 9/2007 | Aggarwal et al. ........ 118/724 |
| 2007/0217896 | A1* | 9/2007 | Kim et al. ................ 414/217 |
| 2008/0063504 | A1 | 3/2008 | Kroetz et al. |
| 2008/0175694 | A1* | 7/2008 | Park et al. ............. 414/217.1 |
| 2008/0232947 | A1* | 9/2008 | van der Meulen et al. ... 414/805 |
| 2008/0298945 | A1 | 12/2008 | Cox et al. |

OTHER PUBLICATIONS

Izya Kremerman et al., U.S. Appl. No. 12/684,780, filed Jan. 8, 2010.

Moriyama et al., "Magnetically Suspended Linear Pulse Motor for Semiconductor Wafer Transfer in Vacuum Chamber", Jul. 1996, NASA Technical Reports Server, pp. 275-288.

Cox et al., U.S. Appl. No. 13/709,485, filed Dec. 10, 2012.

Brodine et al., U.S. Appl. No. 13/205,116, filed Aug. 8, 2011.

Kremerman et al., U.S. Appl. No. 13/662,946, filed Oct. 29, 2012.

International Search Report and Written Opinion of International Application No. PCT/US12/068711 mailed Mar. 18, 2013.

International Search Report and Written Opinion of International Application No. PCT/US12/063110 mailed Mar. 19, 2013.

International Preliminary Report on Patentability of International Application No. PCT/US12/063110 (16628/PCT) mailed May 15, 2014.

* cited by examiner

SYSTEMS, APPARATUS AND METHODS FOR TRANSPORTING SUBSTRATES

RELATED APPLICATIONS

The present application claims priority to U.S. Provisional Patent Application No. 61/143,808, filed Jan. 11, 2009, and entitled "SYSTEMS, APPARATUS AND METHODS FOR TRANSPORTING SUBSTRATES IN ELECTRONIC DEVICE MANUFACTURING", which is hereby incorporated herein by reference in its entirety for all purposes.

FIELD OF THE INVENTION

The present invention relates to electronic device manufacturing, and more specifically to systems, apparatus and methods for transporting substrates.

BACKGROUND OF THE INVENTION

Conventional electronic device manufacturing systems may include multiple process chambers and load lock chambers. Such chambers may be included in cluster tools, for example, where substrates may be transported between the respective process chambers and load lock chambers. These systems and tools may employ a robot apparatus to move the substrates between the various chambers (e.g., process chamber to process chamber, load lock chamber to process chamber, and process chamber to load lock chamber). Efficient and precise transport of substrates between the various system chamber components may be important to system throughput, thereby possibly lowering overall operating costs.

Accordingly, systems, apparatus and methods for efficient and precise movement of the substrates are desired.

SUMMARY OF THE INVENTION

In one aspect a robot apparatus is provided, which includes an upper arm; a forearm coupled to the upper arm; and a wrist member coupled to the forearm wherein the wrist member is adapted to carry a substrate and is independently rotatable relative to the forearm in an X-Y plane, and wherein the wrist member is remotely driven.

In another aspect, a robot apparatus is provided, which includes an upper arm having a shoulder axis and an elbow axis, the upper arm adapted for rotation in an X-Y plane about the shoulder axis; a forearm coupled to the upper arm having a wrist axis, the forearm adapted for independent rotation in the X-Y plane about the elbow axis; a wrist member coupled to the forearm and adapted for independent rotation in the X-Y plane about the wrist axis, wherein the wrist member is adapted to carry a substrate; a first drive member adapted for rotation about the shoulder axis, the first drive member being coupled to a first driven member by a first connector whereby rotation of the first drive member is adapted to rotate the forearm in the X-Y plane about the elbow axis; and a second drive member adapted for rotation about the shoulder axis, the second drive member being coupled to a second driven member by a second connector whereby rotation of the second drive member is adapted to rotate the wrist member in the X-Y plane about the wrist axis.

In another aspect, an electronic device processing system is provided, which includes a transfer chamber; at least one process chamber coupled to the transfer chamber; at least one load lock chamber coupled to the transfer chamber; and a robot apparatus positioned in the transfer chamber and adapted to transport substrates between the chambers, the robot apparatus including an upper arm having a shoulder axis and an elbow axis, the upper arm adapted for rotation in an X-Y plane about the shoulder axis, a forearm coupled to the upper arm and adapted for rotation in an X-Y plane about the elbow axis, the forearm including a wrist axis, and a wrist member coupled to the forearm and adapted for independent rotation in an X-Y plane about the wrist axis wherein the wrist member is adapted to carry a substrate, and wherein the wrist member is driven through the shoulder axis.

In another aspect, a electronic device processing system is provided which includes a vacuum transfer chamber; at least one process chamber coupled to the vacuum transfer chamber; a robot apparatus positioned in the vacuum transfer chamber and adapted to transport a substrate to the at least one process chamber, the robot apparatus including: an upper arm, a forearm coupled to the upper arm, and a wrist member coupled to the forearm wherein the wrist member includes an end effector adapted to carry the substrate, and wherein the wrist member is adapted for independent rotation in an X-Y plane and the wrist member is driven from outside the vacuum transfer chamber.

In another aspect, a method of transporting a substrate within an electronic device processing system is provided including the steps of providing robot apparatus having an upper arm, a forearm, a wrist member, and an end effector in a chamber, the end effector adapted to carry a substrate; and independently moving the wrist member from outside the chamber.

Numerous other aspects are provided in accordance with these and other aspects of the invention. Other features and aspects of the present invention will become more fully apparent from the following detailed description, the appended claims and the accompanying drawings.

DETAILED DESCRIPTION

Electronic device manufacturing may utilize robotic apparatus for movement of substrate and substrate carriers between locations within the manufacturing fabrication facility. For example, a robot apparatus may reside in a transfer chamber and be used to transfer one or more substrates (e.g., silicon wafers, glass plates, etc.) between various processing chambers and/or load lock chambers of a processing tool. In many instances, such process and/or load lock chambers may be operated under a vacuum. Accordingly, robot apparatus may likewise need to be positioned in, and be able to operate within, a vacuum environment. Furthermore, because particle generation may be detrimental to substrate processing and substrate quality, the minimization of particle generation by the robot apparatus is important. In addition, in order to reduce an overall size of the transfer chamber, robots having a small operating envelope may be desirable.

In accordance with one aspect of the invention, a robot apparatus may be provided with an ability to articulate its arms in different rotational directions. In particular, the arms may be adapted for independent rotation relative to one another. Adding additional articulation functionality may enable the arms of the robot to be made much smaller (shorter). Accordingly, robot motion may be carried out in a smaller space envelope, such that robotic transportation of substrates within the substrate processing system may require a smaller operating envelope. Furthermore, being able to make the robot arms shorter may possibly lead to lower vertical deflections at the end effector. Further, having shorter robot arms may provide shorter settling times. Settling time is the time after making an abrupt movement for the end effector to substantially stop vibrating.

Additionally, the added functionality provided by independent arm motion may allow the robot to service (pick and place) substrates into process chambers whose facet lines are nonfocalized with the shoulder axis of the upper arm of the robot. A nonfocalized process chamber, as used herein, means the facet line does not pass through the shoulder axis of the robot apparatus (see FIG. 2 for example). In this type of process chamber configuration, at least an additional process chamber may be added in the system, which may desirably increase a number of processing steps that may occur within a processing tool and/or may also increase a number of substrates that may be processed in the tool at one time. Accordingly, robot apparatus including enhanced functionality in terms of increased degrees of rotational freedom and/or independent rotational capability are sought after, especially robot apparatus with increased degrees of rotational freedom in an X-Y plane.

Figure 10:
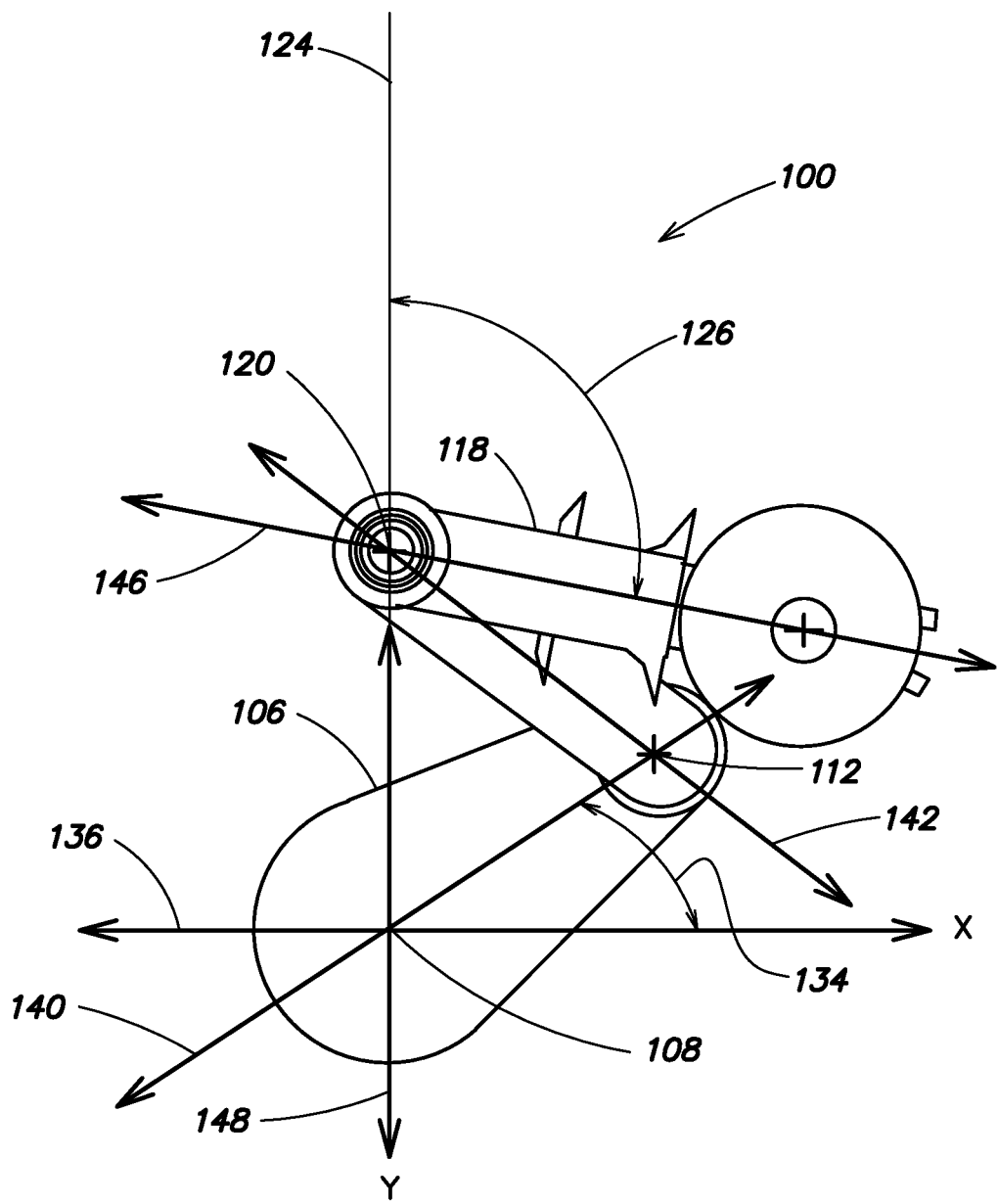
FIG. 10 is a top plan view of an embodiment of a robotic apparatus of FIG. 1 shown in a seventh orientation according to embodiments of the present invention.

Accordingly, in another aspect the present invention is a robot apparatus including an upper arm, a forearm coupled to the upper arm, and a wrist member coupled to the forearm. The wrist member may include an end effector adapted to carry a substrate which may be processed in a processing tool. The forearm and the wrist member may be adapted for independent rotation in an X-Y plane. The X-Y plane is a plane parallel to a plane in which the substrates lie during processing (see FIG. 10). Each of the forearm and the wrist member may also rotate independently relative to the upper arm in an X-Y plane. As a result, the robot apparatus may be advantageously adapted to provide a wrist member which may translate in an X-Y plane but also impart yaw movement in the X-Y plane to the wrist member. Likewise, these motions may be imparted to the end effector. Accordingly, the robot apparatus may adeptly service by accomplishing puts and picks of substrates to and from substrate processing systems including chambers where a facet line of one or more of the chambers is nonfocalized. Furthermore, as many as six process chambers may be serviced by a single robot, for example, in a relatively small special envelope in such nonfocalized systems. Optionally, when used in conventional focalized facet systems, the size of the transfer chamber and/or the robot apparatus may be reduced.

In another aspect, a motive power device which provides the motive power to rotate the forearm and the wrist member may not be located on the robot arms or the wrist member. In particular, in accordance with another aspect, a robot apparatus is provided where the wrist member is adapted for independent rotation. Further, in accordance with another aspect, the wrist member and the forearm are both adapted for independent rotation. In yet a further aspect, the wrist member may be remotely driven from a remote location, such as from outside of the chamber which the forearm and wrist member reside. As such, the motive power devices driving the forearm and wrist member may be located outside of the chamber in which the robot arms operate. Additionally, the forearm may be remotely driven, as well as the upper arm. According to some embodiments, the wrist member is driven by a drive system operatively driven through the shoulder axis. Accordingly, in one possible advantage, particle generation within the chamber may be minimized because the motive power devices, such as electric motors, are remotely located outside of the chamber.

Further details of exemplary embodiments of the invention are described below with reference to FIGS. 1-13.

Figure 1:
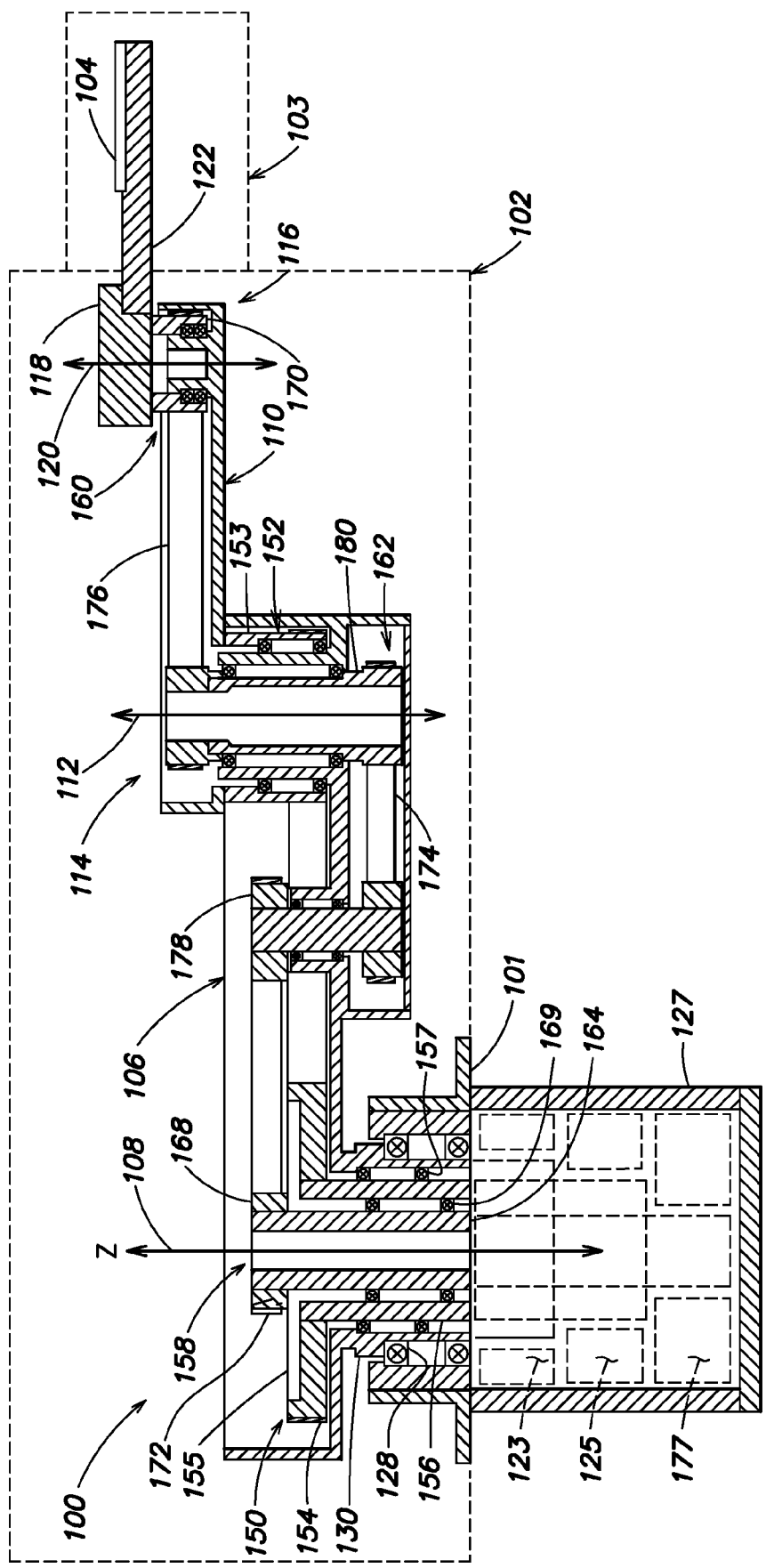
FIG. 1 is a cross-sectional side view of a first robot apparatus according to embodiments of the present invention.
Figure 2:
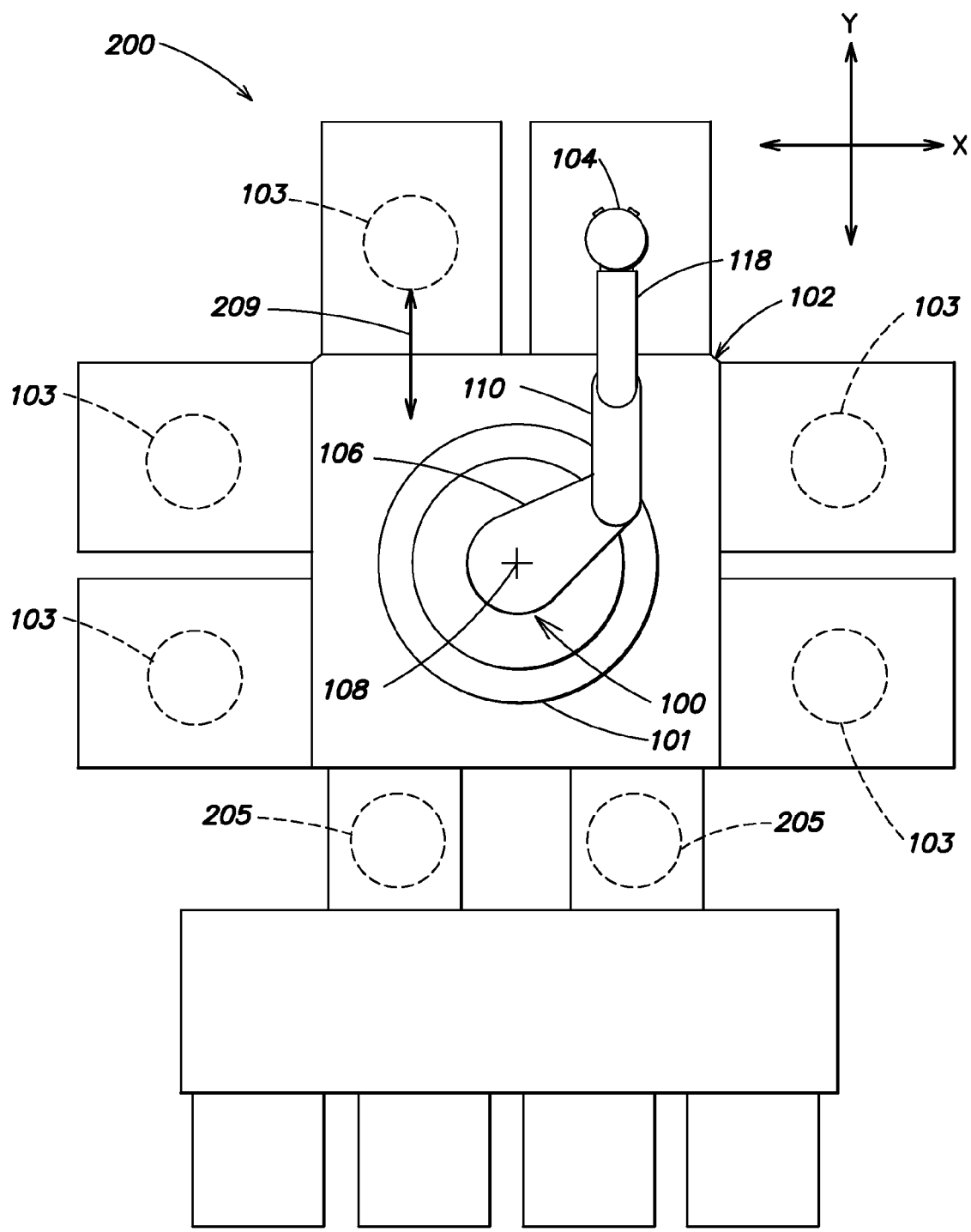
FIG. 2 is a top plan view of an embodiment of a substrate processing system including a robotic apparatus of FIG. 1 according to embodiments of the present invention.

FIG. 1 illustrates a cross-sectional side view of an exemplary embodiment of a robot apparatus 100 according to the present invention. The robot apparatus 100 may include a base 101, which may be adapted to mount the robot apparatus 100 for operation within a transfer chamber 102. The walls of the transfer chamber are shown dotted. The transfer chamber 102 may be a vacuum chamber, for example. The transfer chamber 102 may contain at least a portion of the robot apparatus 100 and the robot apparatus 100 may be adapted to transport one or more substrates 104 between various chambers, such as process chamber 103, which may be coupled to the transfer chamber 102. In particular, the robot apparatus 100 may be adapted to transfer substrates 104 between one or more load lock chambers 205 and one or more process chambers 103 of a system 200 for processing substrates 104 as best shown in FIG. 2.

Again referring to FIG. 1, the robot apparatus 100 may include an upper arm 106, which is adapted to rotate in an X-Y plane (see FIG. 2) relative to the base 101 about a shoulder axis 108. The X-Y plane is a plane of operation of the robot apparatus 100 for feeding substrates 104 between the various chambers 103, 205; the plane being perpendicular to the shoulder axis 108 and also the Z-axis shown in FIG. 1 about which the upper arm 106 is adapted to rotate.

A forearm 110 having an inboard end 114 and an outboard end 116 may be coupled to the upper arm 106 at an elbow axis 112. The forearm 110 may be adapted to rotate in the X-Y plane relative to the upper arm 106 about the elbow axis 112 at its inboard end 114, for example. A wrist member 118 may be coupled to the forearm 110 and may be adapted for rotation in the X-Y plane relative to the forearm 110 about a wrist axis 120. The wrist axis 120 may be located at the outboard end 116 of the forearm 110. An end effector 122 may be included on the wrist member 118 and may be adapted to carry one or more substrates 104 between respective chambers, such as chambers 103, 205 of the processing tool, for example. In the depicted embodiment, the end effector 122 and the wrist member 118 are shown as separate connected articles. However, in other embodiments, the wrist member 118 and end effector 122 may optionally be integral with one another.

In accordance with one aspect of the invention, the robot apparatus 100 may include a structure, which may allow for the wrist member 118, and thus the included end effector 122, to carry out a yaw motion in the X-Y plane. This yaw motion may be carried out by the apparatus 100 independent of the rotation of the upper arm 106 and the forearm 110, for example. This may best be seen with reference to FIG. 3 where the wrist member 118 is shown in a rotated or yawed condition by being angularly offset in the X-Y plane by an angle 126 relative to a conventional SCARA axis 124.

Moreover, in accordance with another aspect of the invention, independent rotation of each of the upper arm 106, forearm 110, and wrist member 118 may be accomplished. For example, independent rotation of the upper arm 106 about the shoulder axis 108 in the X-Y plane may be provided in both the clockwise or counterclockwise directions. In particular, the upper arm angle 134 may be 0 degrees+/−up to about 360 degrees or more. In other words, the upper arm angle 134 may be 0 to 360 degrees or more, or 0 to −360 or less.

Independent rotation of the forearm 110 about the elbow axis 112 in the X-Y plane may also be provided in both the clockwise or counterclockwise directions. In particular, the forearm angle 138 may be 0 degrees+/−up to about 140 degrees, for example. In other words, the forearm angle 138 may be anywhere between about −140 degrees and about 140 degrees. As such, independent of the angular rotation which the upper arm 106 is undergoing, the forearm 110 may be rotated in the same direction, opposite direction or held stationary relative to the upper arm 106. Moreover, the forearm 110, may be rotated faster than, slower than, or at the same angular rate as the upper arm 106.

Likewise, rotation of the wrist member 118 about the wrist axis 120 may be provided in a clockwise or counterclockwise direction relative to the forearm 110. In particular, a wrist angle 144 may be 90 degrees+/−up to about 140 degrees, for example. In other words, the wrist angle 144 may be anywhere between about −50 degrees and about 230 degrees. Accordingly, with the addition of yaw capability in the X-Y plane as compared to a conventional SCARA robot, and/or the ability to independently rotate the wrist relative to the forearm 110, nonfocalized process chambers of a substrate processing system 200 may be more readily reached and serviced. An example of a process chamber which is nonfocalized is the process chamber 103 shown in FIG. 2. Optionally, in more conventional systems, the size of the transfer chamber of the substrate processing system may be reduced. Of course, it should be recognized that the present invention robot apparatus may find utility in other chambers, such as in a chamber of a factory interface, for example, where the robot apparatus may be adapted to transfer substrates, or carriers including substrates, between a load port and a load lock chamber.

In more detail, and again referring to FIG. 1, the rotation of the upper arm 106 of the apparatus 100 in the X-Y plane relative to the base 101 may be accommodated by one or more support bearings 128, which may be provided between the base 101 and a pilot portion 130 of the arm 106 which may extend in along the Z axis towards the base 101 from a main portion of the upper arm 106. The support bearing 128 may be any suitable member for allowing rotation and restraining vertical motion along the shoulder axis 108. The support bearing 128 may be a sealed ball bearing, for example. Other types of bearings or bushings may be used. In some embodiments, some limited Z axis motion capability may be provided such that a put and a pick of a substrate 104 may be accomplished in a substrate processing system where stationary lift pins or stationary substrate platforms are provided. Such Z axis capability may be provided by a conventional Z axis motive device (not shown) coupled to the pilot portion 130 and causing all the arms 106, 110 and the end effector 122 to translate in the Z direction by a sufficient amount to accommodate a pick or put of the substrate, for example.

In the depicted embodiment, a rotation of the upper arm 106 relative to the base 101 may be accommodated independently of the forearm 110 and also independently of the wrist member 118, for example. By independent rotation, what is meant is that the respective upper arm 106, forearm 110 or wrist member 118 may be rotated in a same or different direction or be stationary relative to the other arms or member. For example, no gearing is provided, such as in a conventional SCARA robot, where the rotations of the respective arms are mechanically geared to each other with a predetermined gear ratio (e.g., 1:1, 2:1, etc).

In the depicted embodiment, the independent rotation capability may be illustrated, for example, by the upper arm 106 being rotated and each of the forearm 110 and the wrist member 118 being held stationary relative to the upper arm 106, thus sweeping the forearm 110 and wrist member 118 about the shoulder axis 108 at a same angular velocity as the upper arm 106. As another example, the upper arm 106 and the forearm 110 may be held stationary and only the wrist member 118 may be rotated in the X-Y plane, either clockwise or counterclockwise. In another example, the forearm 110 may be independently rotated relative to the upper arm 106, with the upper arm 106 being held stationary and the wrist member 118 being held stationary relative to the forearm 110 thereby sweeping the forearm 110 and wrist member 118 in the X-Y plane at the same angular velocity. In another interesting example, the wrist member 118 may be rotated clockwise, while the forearm 110 may be rotated counterclockwise. Of course, each of the upper arm 106, forearm 110, and wrist member 118 may be independently rotated all at once in any combination such that any number of maneuvers of the end effector 122 may be accomplished. Accordingly, the maneuverability of the end effector 122 is greatly enhanced relative to conventional SCARA robots. In examples described later with reference to FIGS. 12 and 13, the wrist member 118 and/or end effector 122 may be inserted through a facet and into the process chamber at other than a perpendicular orientation to the facet, or the robot apparatus may be placed within the transfer chamber at a location of some of the focal points, and still service other nonfocalized process chambers (See FIG. 13).

Rotation of the various arms may be provided by a remote motive power device. The motive power device may be any suitable device for accomplishing precision motion of the upper arm 106, forearm 110, and the wrist member 118 such as an electrical, pneumatic or hydraulic motor or actuator or the like. For example, rotation of the upper arm 106 may be by a motive power device 123 (shown dotted) located outside of the chamber 102, such as in a motor housing 127, i.e., the upper arm is remotely driven. In the case where the motive power device 123 is an electric motor, the rotor may be attached to the pilot portion 130 and the stator may be attached to the motor housing 127, for example. In particular, in some embodiments, the motive power device may be provided in an area which is not under a vacuum, under a lesser vacuum than the chamber 102, or at least physically separated from the chamber 102. In the case where the chamber 102 is a vacuum chamber, the various support bearings at the location of the shoulder axis 108 may be sealed bearings and/or vacuum seals may be provided at the respective shafts and pilots thereof, or the entire motor housing may be evacuated.

Figure 3:
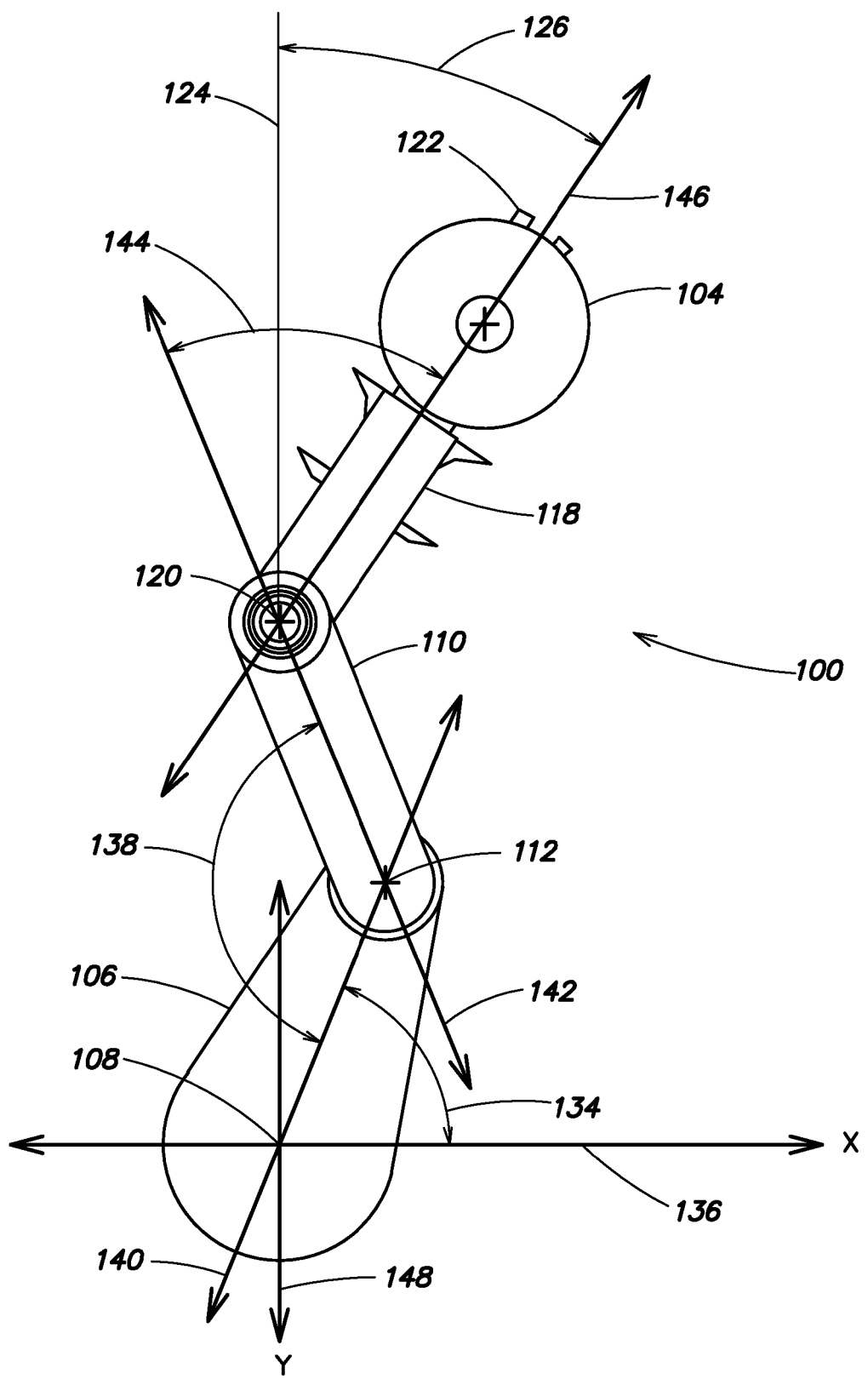
FIG. 3 is a top plan view of an embodiment of a robotic apparatus of FIG. 1 shown in a first orientation according to embodiments of the present invention.

The forearm 110 may also be adapted for independent rotation relative to the upper arm 106 in the X-Y plane and may be remotely driven. In particular, the forearm 110 may rotate in the X-Y plane through the forearm angle 138 relative to the upper arm 106 as discussed above, and as measured between respective upper arm axis 140 and the forearm axis 142 (see FIG. 3). As shown in FIG. 3, the upper arm axis 140 and forearm axis 142 extend between the shoulder axis 108 and the elbow axis 112, and between the elbow axis 112 and the wrist axis 120, respectively. The details of how the rotation is accomplished will be discussed below.

As with the forearm 110 being independently rotatable relative to the upper arm 106, the wrist member 118 may also be adapted for independent rotation relative to the forearm 110 in the X-Y plane and may be remotely driven. In particular, the wrist member 118 may be adapted to rotate through a wrist member angle 144, discussed above, and as measured between the forearm axis 142 and the wrist member axis 146. The wrist member axis 146 extends between the elbow axis 120 and along a centerline of the wrist member 118. Generally, the substrate 104 may be positioned such that the substrate 104 is centered on the centerline of the wrist member 118. Likewise, the end effector 122 may extend along the wrist member axis 146 and may be symmetrical thereabout.

To accomplish the independent rotation in the X-Y plane, the wrist member 118 and/or the upper arm 106 and/or forearm 110 may be subject to being driven independently as well as remotely. For example, in the depicted embodiment, forearm 110 and the wrist member 118 may be independently driven through a drive system and through the shoulder axis. To accomplish the independent rotation of the forearm 110 in the X-Y plane and about the elbow axis 112 of the upper arm 106, a suitable mechanical drive system may be provided to drive the forearm 110. FIG. 3 clearly illustrates the X axis 136 and the Y axis 148 of the X-Y plane.

The drive system adapted to provide the forearm rotation is best shown in FIG. 1. The drive system may include a first drive member 150 adapted for rotation about the shoulder axis 108. The first drive member 150 may be adapted and configured to be coupled to a first driven member 152, which is coupled to or integral with the forearm 110. In the depicted embodiment, the coupling is accomplished by a first connector 154, which may be a metal drive belt, for example. However, any connector mechanism or device that kinematically connects the first drive member 150 and first driven member 152 may be employed. In operation, rotation of the first drive member 150 through the shoulder axis 108 may be the operation of a motive power device 125, such as a permanent magnet or variable reluctance electric motor, which may rotate the forearm 110 in the X-Y plane. Other types of motive power devices may be used. The first drive member 150 may include a generally cylindrical drive pulley 155 and a shaft 156 coupled thereto wherein the shaft 156 is adapted to drive the drive pulley 155. The shaft 156 may be supported relative to the base 101 and the upper arm 106 by a support bearing 157 such that the shaft 156 may rotate about the shoulder axis 108 but is restrained from translational movement in the X-Y plane.

The first driven member 152 on the forearm 110 may be a pilot 153 extending downwardly from the body of the forearm 110. The pilot 153 may be rotatably supported relative to the upper arm 106 about the elbow axis 112 by a support bearing or the like. In the depicted embodiment, the pilot 153 of the forearm 110 is shown as being a separate member. However, it should be recognized that the pilot 153 and the main body of the forearm 110 may be integral with one another.

Figure 4:
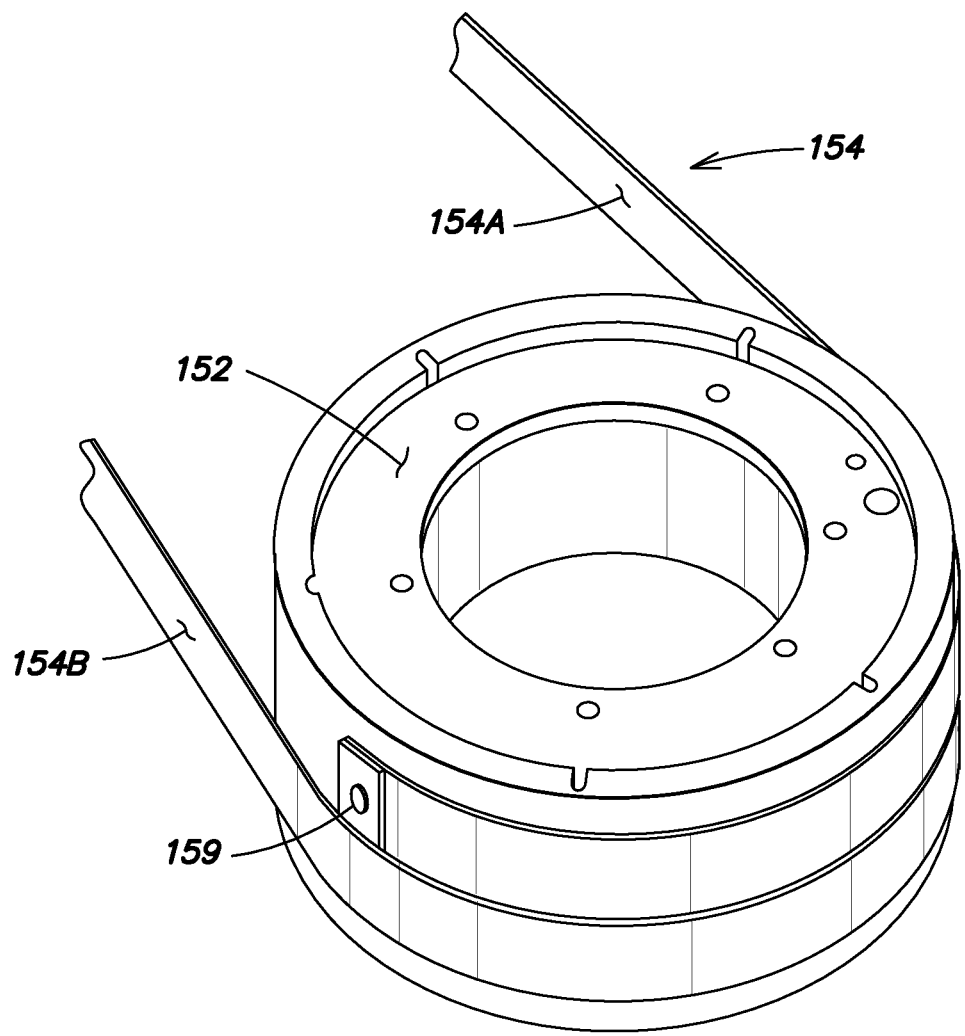
FIG. 4 is a perspective view of an exemplary embodiment of a driven member and connector according to embodiments of the present invention.
Figure 5:
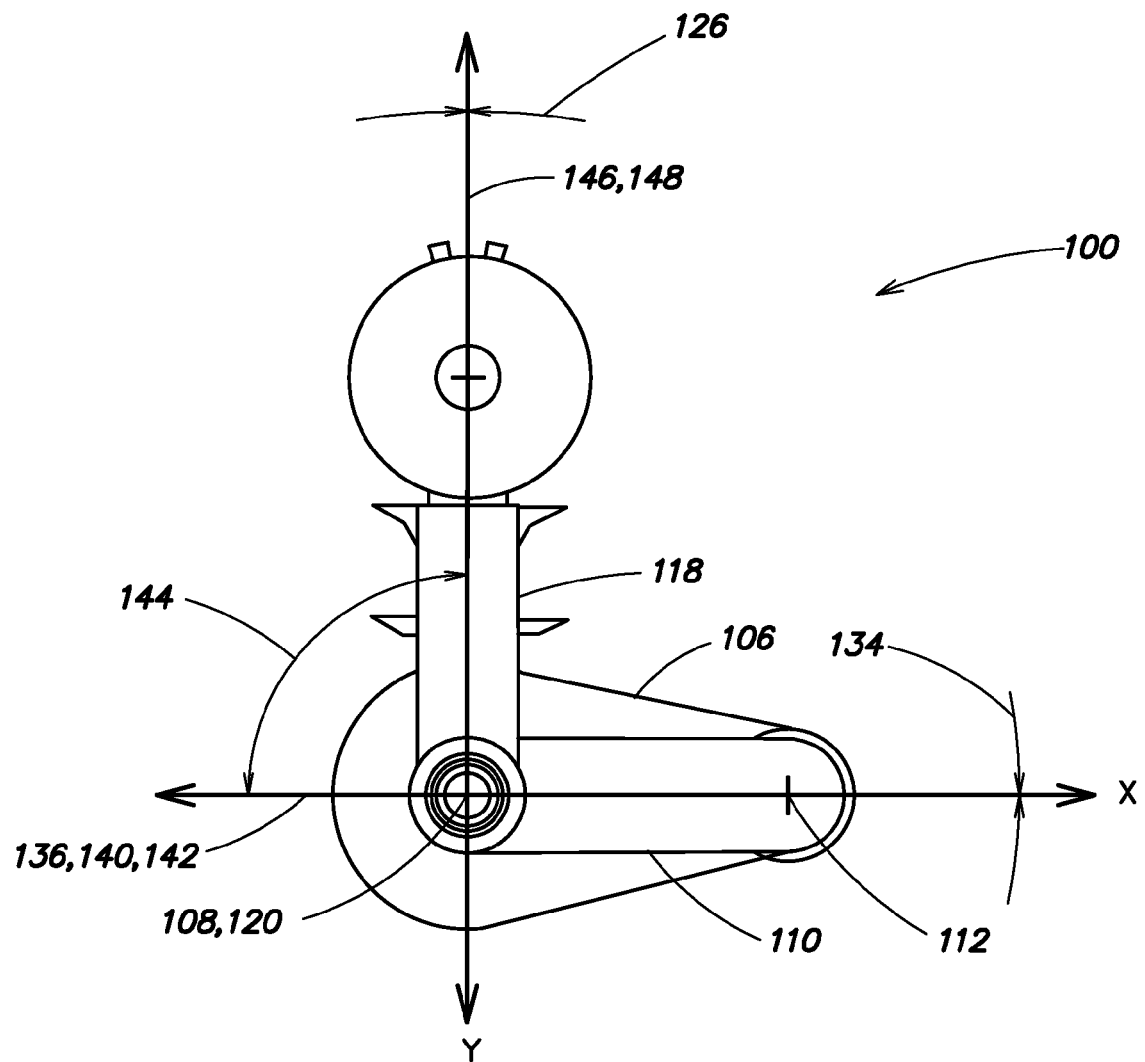
FIG. 5 is a top plan view of an embodiment of a robotic apparatus of FIG. 1 shown in a second (neutral) orientation according to embodiments of the present invention.
Figure 6:
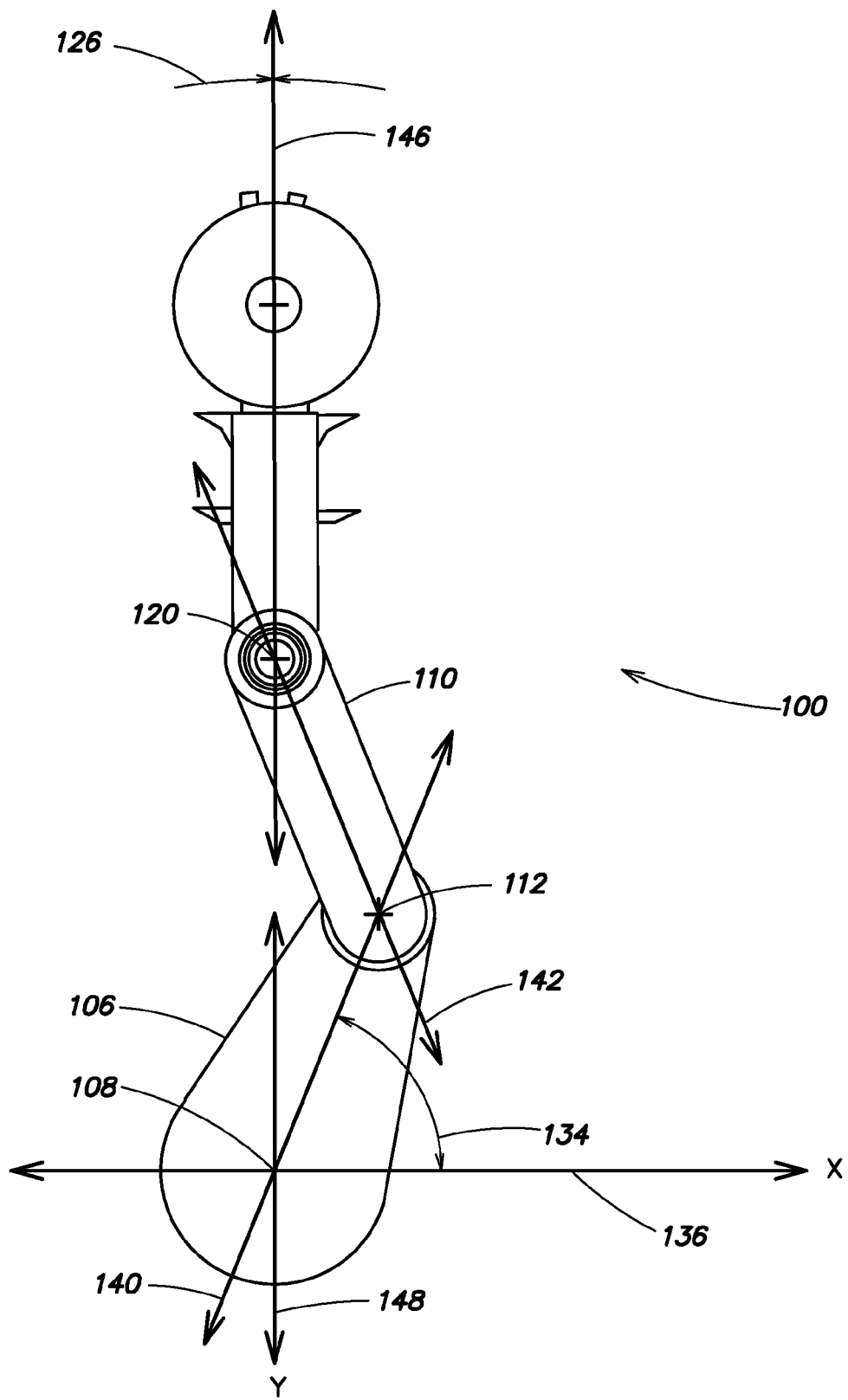
FIG. 6 is a top plan view of an embodiment of a robotic apparatus of FIG. 1 shown in a third orientation according to embodiments of the present invention.

An example of a portion of a drive system is depicted in FIG. 4 wherein a metal belt is the first connector 154. The connector 154 is shown extending about a periphery of a driven member, such as driven member 152, with an end of one side of the connector 154A being pinned to the driven member 152 by pin 159. A second side of the connector 154B is likewise pinned to the other side of the driven member 152. Similar pinning of the sides of the connector 154A, 154 may be provided on the first drive member 150. This configuration may allow a rotational capability of up to about +/−140 degrees at each of the elbow axis 112 and wrist axis 120. Similar connectors may be used for all the connections between the drive members and driven members described herein. In some embodiments, the metal belts may overlap one another (be placed on top of one another).

Again referring to FIG. 1, the robot apparatus 100 may further include a second drive system adapted to provide the independent rotation of the wrist member 118 driven through the shoulder axis 108 and the elbow axis 112. The second drive system includes a second drive member 158 adapted for rotation about the shoulder axis 108; the second drive member 158 being coupled to a second driven member 160 by a second connector 162 whereby rotation of the second drive member 158 rotates the wrist member 118 in the X-Y plane. Like the first drive member 150, the second drive member 158 may include a pulley 168 coupled to a shaft 164. The shaft 164 may be adapted for rotation about the shoulder axis 108 such as by one or more bearings 169. The shaft 164 may be received and rotate inside the shaft 156 and the shaft 156 may be received inside and rotate within pilot portion 130.

The second connector 162 of the second drive system may include any suitable structure which may connect the second drive member 158 to the second driven member 160 and which is adapted to facilitate rotation of the second driven member 160. In the depicted embodiment, the second connector 162 is comprised of a series of pulleys and belts, such as metal belts. In particular, the second connector 162 may include a first belt 172, a second belt 174, and a third belt 176, which are connected between first and second intermediate members 178 and 180, and pulleys 168,170. In operation, when the second drive member 158 is driven by a motive power device 177 (e.g. a motor), then the first belt 172 is rotated which, in turn, rotates the first intermediate member 178. This causes a second belt 174 coupled to the first intermediate member 178 to rotate, which results in a rotation of the second intermediate member 180. In turn, the third belt 176 may be rotated by a rotation of the second intermediate member 180. This causes rotation of the pulley 170 of the second driven member 160, which causes independent yaw motion of the wrist member 118 in the X-Y plane, as well as yaw motion of the end effector 122 in the X-Y plane. Intermediate members 178 and 180 may be mounted for rotation in the upper arm 106. The first intermediate member 178 may be mounted by a support bearing or bearings roughly midway on the upper arm 106, while the second intermediate member 180 may be mounted for rotation by one or more support bearings at the elbow axis 112.

As should be recognized, these independent motions such as independent yaw of the wrist member 118 in the X-Y plane and independent rotation in the X-Y plane of the forearm 110 relative to the upper arm 106 may allow a wide range of delivery paths to be used for delivering the substrate to its intended destination.

Figure 7:
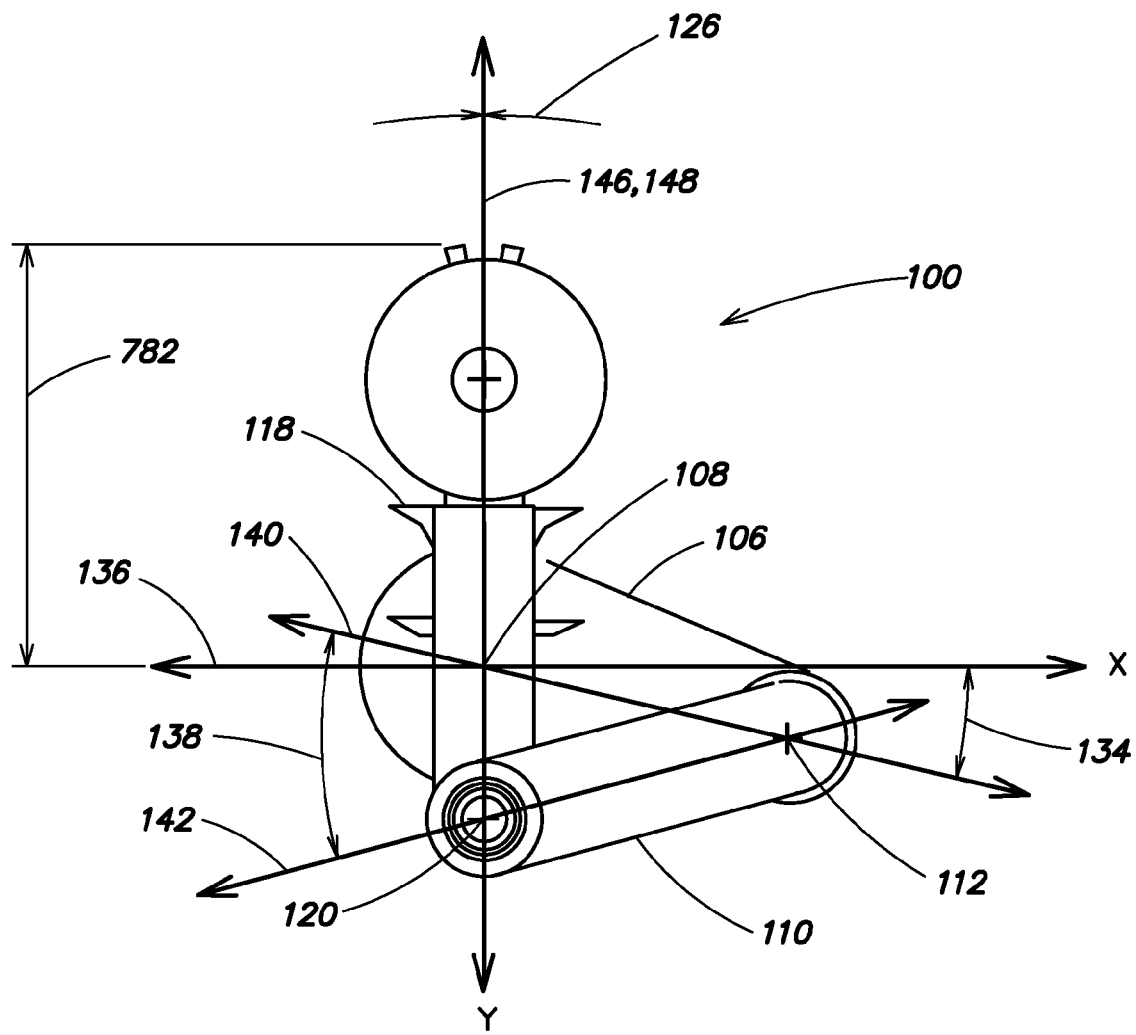
FIG. 7 is a top plan view of an embodiment of a robotic apparatus of FIG. 1 shown in a fourth orientation according to embodiments of the present invention.
Figure 8:
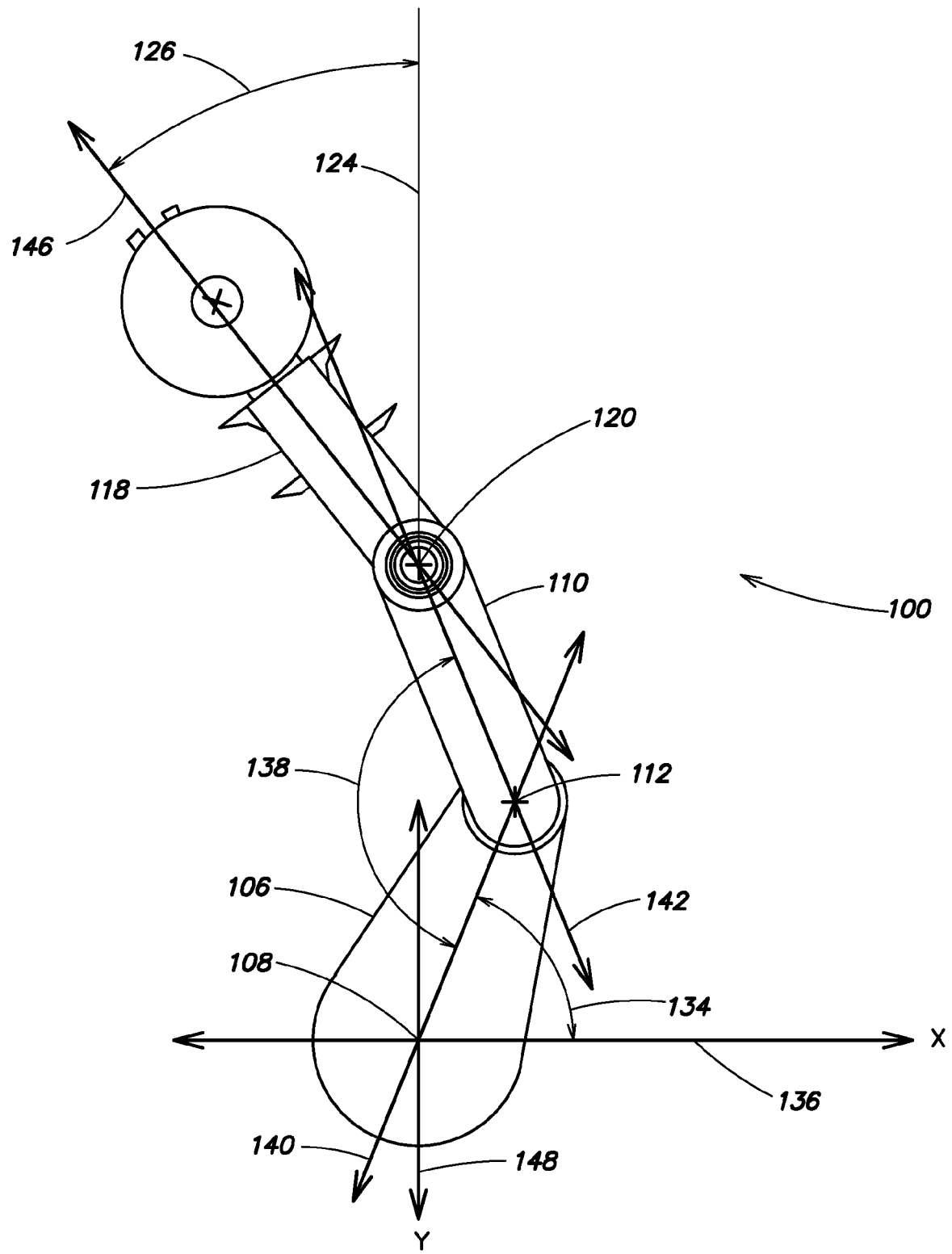
FIG. 8 is a top plan view of an embodiment of a robotic apparatus of FIG. 1 shown in a fifth orientation according to embodiments of the present invention.
Figure 9:
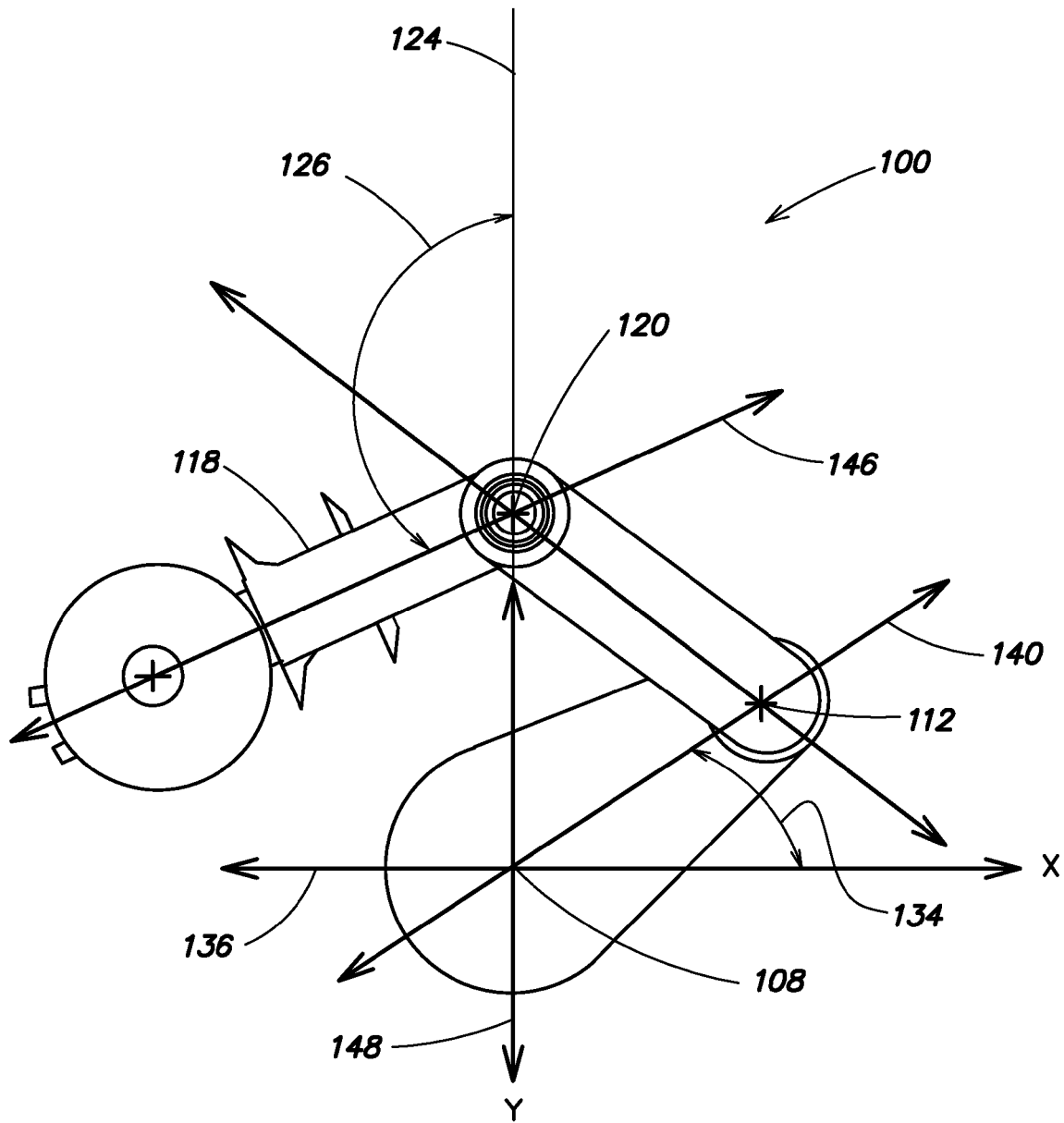
FIG. 9 is a top plan view of an embodiment of a robotic apparatus of FIG. 1 shown in a sixth orientation according to embodiments of the present invention.

Examples of configurations that may be achieved by embodiments of the present invention are shown in FIGS. 2-3 5-10, and 12-13, for example. Other configurations are possible. Furthermore, a wide variety of movements of the upper arm 106, forearm 110 and the wrist member 118 may be provided such that a space envelope required for accomplishing transport of substrates by the robot apparatus 100 may be minimized. For example, as shown in FIG. 7, the upper arm angle 134 and the forearm angle 138 may both be negative. This may cause the overall swing radius 782 from the shoulder axis 108 to an outermost portion of the end effector to be substantially smaller than in a conventional SCARA.

Further, enabling independent motion of the forearm 110 and independent yaw motion of the wrist member 118 may allow insertion of the substrate 104 into nonfocalized process chambers which include facet lines which are not focalized to a point, such as the configuration shown in FIG. 2 for example. Facet line as used herein is defined as an axis in the X-Y plane which is drawn normal to a line projected across an entry (facet) into a process chamber 103. An example of a facet line is shown by line 209 in FIG. 2. In nonfocalized systems, the facet lines do not pass through the shoulder axis 108 of the robot apparatus 100.

Figure 11:
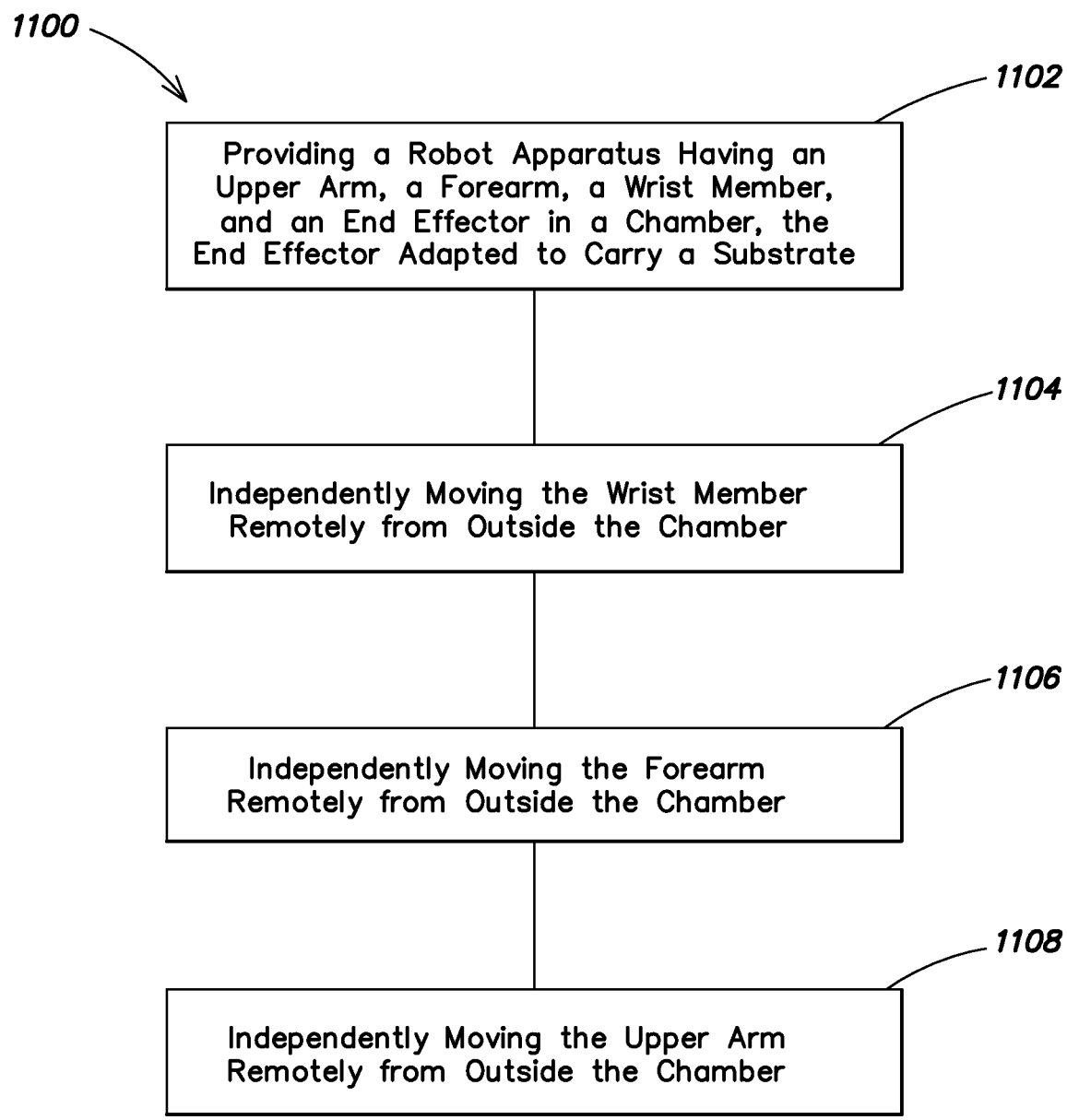
FIG. 11 is a flowchart depicting a method of operating a robot apparatus according to the present invention.

A method of transporting a substrate within an electronic device manufacturing system according to some embodiments of the present invention is provided in FIG. 11. According to the method 1100, in 1102, a robot apparatus is provided having an upper arm, forearm, a wrist member, and an end effector which are provided in a chamber, such as a vacuum transfer chamber. The end effector is adapted to carry a substrate. In 1104, the wrist member is independently rotated in the X-Y plane by a remote motive power device mounted outside the chamber. For example, the wrist member may be rotated in the X-Y plane through a connection with a drive system described herein which couples the wrist member to the remote motive power device. The motive power device may be an electric motor received in a motor housing which may be located outside of the chamber, for example.

According to an additional aspect and as shown in 1106, the forearm may also be independently rotated in the X-Y plane remotely from outside the chamber by the operation of a remote motive power device, for example. Likewise, in 1108, the upper arm may be independently rotated in the X-Y plane remotely from outside the chamber with a remote motive power device. In some embodiments, all three of the upper arm, forearm, and end member may be independently rotated in the X-Y plane remotely driven from outside the chamber with a remote motive power device rotationally coupled to each.

Figure 12:
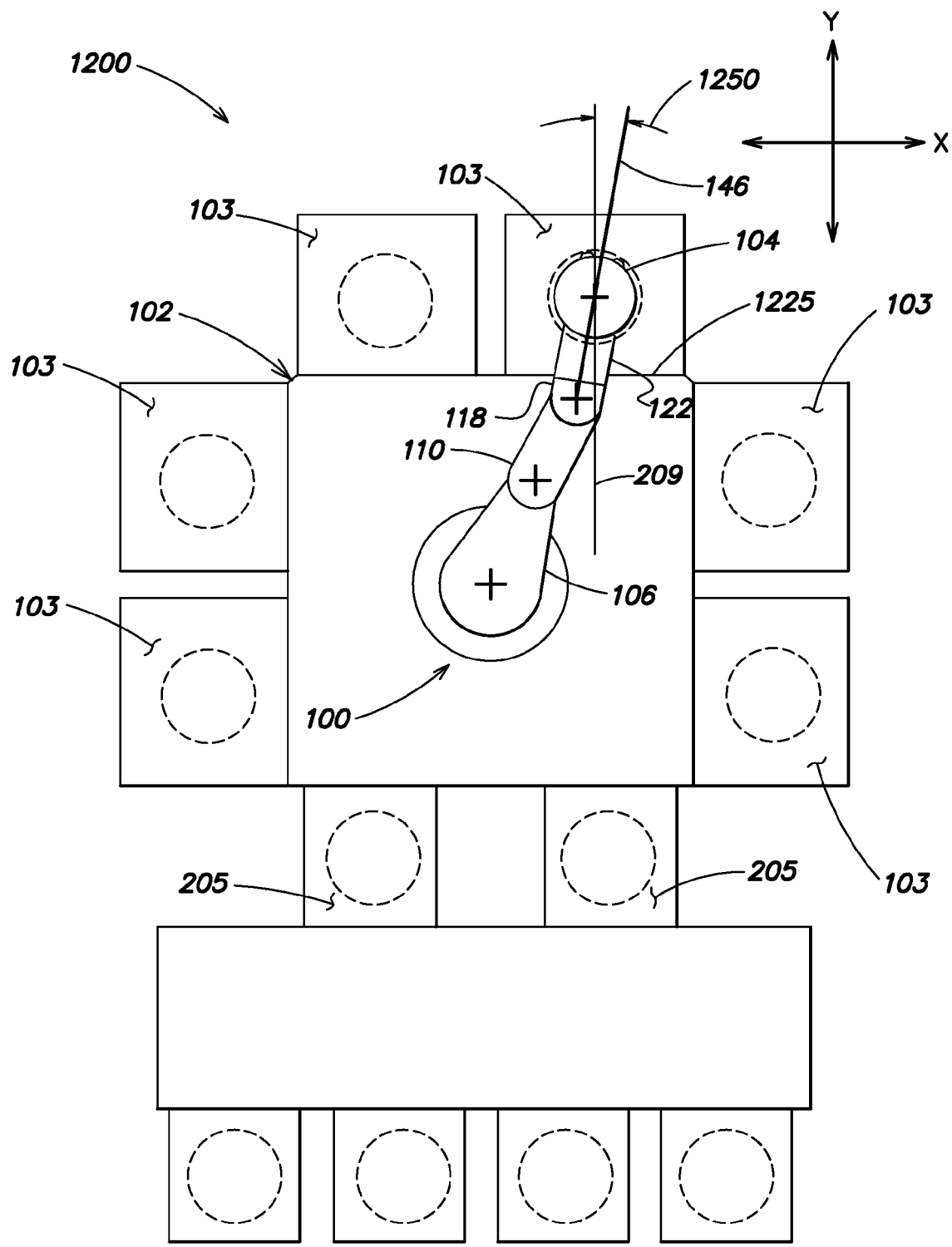
FIG. 12 is a top plan view of an embodiment of a substrate processing system including a robotic apparatus of FIG. 1 according to embodiments of the present invention shown extending into a process chamber with the wrist member being shown in an orientation which is non-perpendicular to the facet and provided at a non-zero angle to a facet line.
Figure 13:
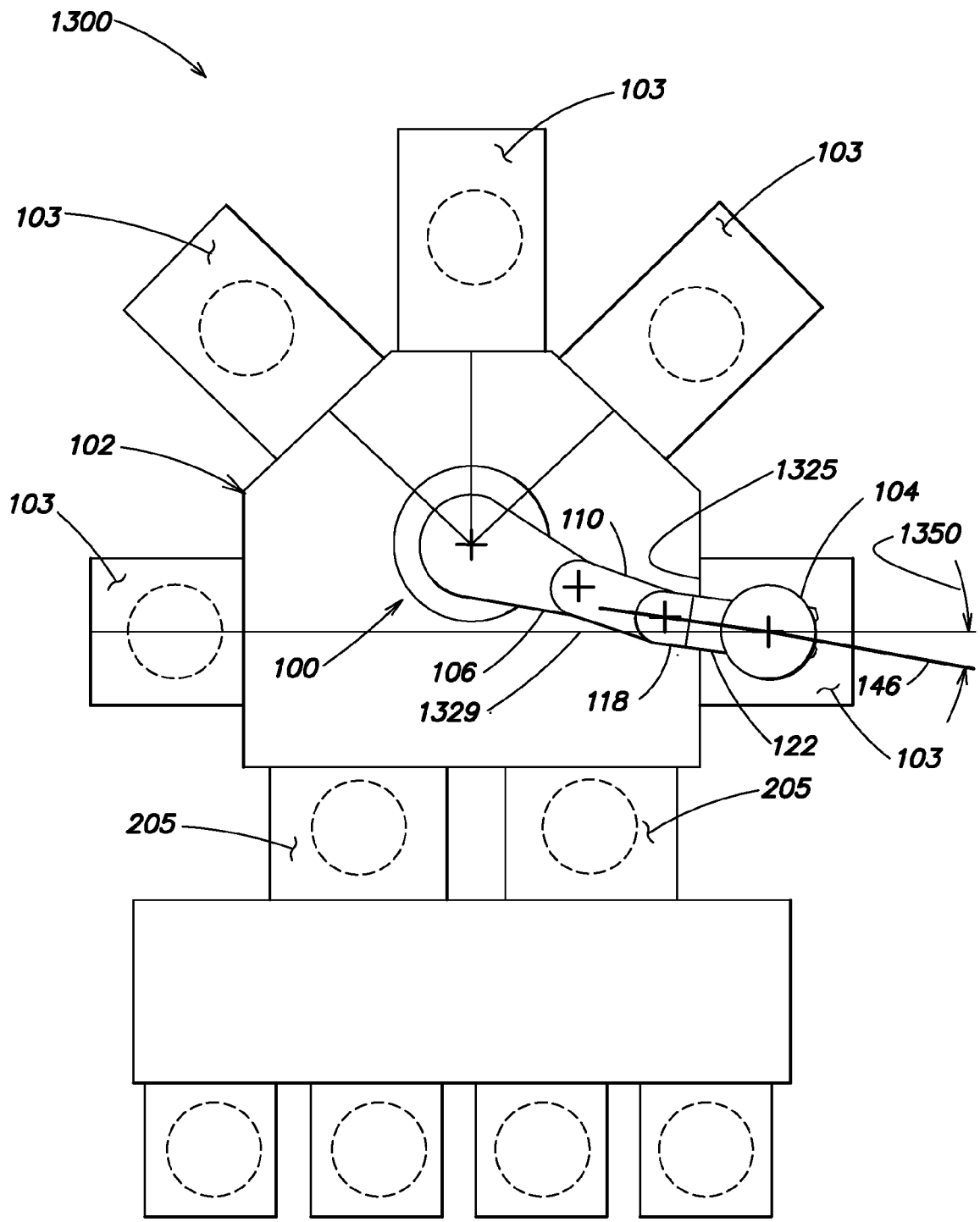
FIG. 13 is a top plan view of an embodiment of a substrate processing system including a robotic apparatus of FIG. 1 according to embodiments of the present invention shown positioned in a transfer chamber with the wrist member being shown in an orientation which is non-perpendicular to a facet of a non-focalized process chamber.

To further illustrate the adeptness of the present invention at servicing various process chambers, FIGS. 12 and 13 are provided. In FIG. 12, a substrate processing system 1200 is provided, including a robot apparatus 100 adapted for operation within a transfer chamber 102 of the system 1200. The transfer chamber 102 may be a vacuum chamber, for example. The transfer chamber 102 may contain at least a portion of the robot apparatus 100 (e.g., the working upper arm 106, forearm 110, wrist member 118, and end effector 122) and the robot apparatus 100 may be adapted to transport one or more substrates 104 between various chambers, such as process chambers 103, which may be coupled to the transfer chamber 102. Additionally, the robot apparatus 100 may be adapted to transfer substrates 104 between one or more load lock chambers 205 and one or more process chambers 103 of the system 1200 adapted for processing substrates 104. In particular, the size of the transfer chamber 102 may be made smaller as compared to conventional transfer chambers because of the mobility and independent operation of the upper arm 106, forearm 110, and wrist member 118 in the present invention.

In this embodiment, the wrist member 118 and end effector 122 may be inserted into the process chambers 103 (through a slit valve—not shown) at other than a perpendicular orientation to a facet 1225 of the chamber 102. Because the forearm 110 and the wrist member 118 may be rotationally oriented, as needed, to provide suitable clearance from the walls of the transfer chamber 102 during the motion profile, the overall size envelope of the chamber 102 may be made comparatively smaller. Furthermore, the end effector 122 may be extended into the chamber 103 at other than a perpendicular orientation to the facet 1225. For example, an angle 1250 between a facet line 209 and the wrist axis 146 may be nonzero when the substrate is inserted into the process chamber 103. Thus, the present robot 100 is much more capable in comparison to a conventional SCARA, which can only extend its wrist member directly in line with, and along, the facet line.

FIG. 13 illustrates another substrate processing system 1300 including a robot apparatus 100 according to the present invention, which may be adapted for operation within a transfer chamber 102 of the system 1300. The transfer chamber 102 may be a vacuum chamber, for example. The transfer chamber 102 may contain at least a portion of the robot apparatus 100, as described above, and the robot apparatus 100 may be adapted to transport one or more substrates 104 between various chambers, such as process chambers 103, which may be coupled to the transfer chamber 102. Additionally, the robot apparatus 100 may be adapted to transfer substrates 104 between one or more load lock chambers 205 and one or more process chambers 103 of the processing system 1200 adapted to process substrates 104. In particular, because of the mobility and independent operation of the upper arm 106, forearm 110, and wrist member 118, the robot 100 may adeptly service chambers 103 that are focalized as well as chambers 103 that are nonfocalized. As depicted, the three upper chambers 103 are focalized, in that the shoulder axis of the robot 100 is positioned at the respective focal points of the focal lines for each upper chamber 103. The lower two process chambers are un-focalized in that their respective focal points lie below the shoulder axis of the robot 100.

In the present depiction, it will become apparent that the present invention is adept at servicing non-focalized as well as focalized chambers 103 regardless of where the robot may be positioned within the transfer chamber 102. As depicted, the wrist member 118 and end effector 122 may be inserted into a non-focalized process chamber 103 (through a slit valve—not shown) at other than a perpendicular orientation to a facet 1325 thereof. The forearm 110 and the wrist member 118 may be oriented, as needed, to provide suitable clearance from the walls of the transfer chamber 102 during the motion, yet be oriented to provide extra reach or motion capability to service non-focalized process chambers. As in the previous embodiment, the end effector 122 may be extended into the lower chamber 103 at other than a parallel orientation to a facet line 1329. For example, the wrist member 118 and end effector 122 may be inserted into the process chamber 103 at an angle 1350 which is nonzero.

The foregoing description discloses only exemplary embodiments of the invention. Modifications of the above-disclosed systems, apparatus and methods which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention, as defined by the following claims.

The invention claimed is:

1. An electronic device processing system, comprising:
a vacuum transfer chamber;
at least one process chamber coupled to the vacuum transfer chamber; and
a robot apparatus positioned in the vacuum transfer chamber and adapted to transport a substrate to the at least one process chamber, the robot apparatus including:
an upper arm having a first proximate end and a second remote end, said upper arm remotely drivable by a first motor positioned outside the vacuum transfer chamber, the upper arm capable of independent angular rotation about a shoulder axis in an X-Y plane in both a clockwise and a counterclockwise direction relative to a base,
a forearm having a first proximate end and a second remote end, the first proximate end of the forearm coupled to the second remote end of the upper arm, the upper arm remotely drivable by a second motor positioned outside the vacuum transfer chamber, the forearm capable of independent angular rotation about a elbow axis in an X-Y plane in both a clockwise and a counterclockwise direction relative to the upper arm, and
a wrist member having a first proximate end and a second remote end, the proximate end of the wrist member coupled to the remote end of the forearm, the wrist member includes an end effector adapted to carry the substrate, and
wherein the wrist member and the end effector are capable of independent rotation in an X-Y plane about a wrist axis in a clockwise or a counterclockwise direction relative to the forearm, and the wrist member is remotely drivable by a third motor positioned outside the vacuum transfer chamber,
wherein the first motor, the second motor, and the third motor are coupled to the upper arm, forearm and wrist member respectively via concentrically disposed shafts that extend from the respective motors, and
a connector that connects a first shaft extending from the third motor to the wrist member, wherein the connector includes a first belt from the first shaft to a first intermediate member, a second belt from the first intermediate member to a second intermediate member at a level below the first belt, and a third belt from the second intermediate member to the wrist member at a level above the first belt.

2. The system of claim 1 wherein the at least one process chamber is non-focalized, such that a facet line of the process chamber does not pass through the shoulder axis of the robot apparatus.

3. The system of claim 1 wherein the upper arm rotates independently from the forearm and the wrist member about the shoulder axis in the X-Y plane in both the clockwise and the counterclockwise direction relative to the base from about 0 to 360 degree or more, or about 0 to minus 360 degrees or less rotation.

4. The system of claim 1 wherein the forearm rotates independently from the upper arm and the wrist member about the elbow axis in the X-Y plane in both the clockwise and the counterclockwise direction relative to the base from about a minus 140 degree to about a plus 140 degree rotation.

5. The system of claim 1 wherein the wrist member and the end effector rotate independently from the upper arm and forearm about the wrist axis in an X-Y plane in the clockwise or the counterclockwise direction relative to the forearm from about a minus 50 degree to about 230 degree rotation.

6. A method of transporting a substrate within an electronic device processing system, comprising:
providing robot apparatus having an upper arm, a forearm, a wrist member, and an end effector in a vacuum transfer chamber, the end effector adapted to carry a substrate; and
independently moving each of the upper arm, the forearm and the wrist member from outside the vacuum transfer chamber by independent drives remotely positioned with respect to the upper arm, the forearm and the wrist member, wherein the wrist member and the end effector rotate in an X-Y plane about a wrist axis in a clockwise or a counterclockwise direction relative to the forearm, and the wrist member and the end effector are driven into at least one process chamber,
wherein the independent drives include a first motor, a second motor, and a third motor coupled to the upper arm, forearm and wrist member respectively via concentrically disposed shafts that extend from the respective motors, and
a connector that connects a first shaft extending from the third motor to the wrist member, wherein the connector includes a first belt from the first shaft to a first intermediate member, a second belt from the first intermediate member to a second intermediate member at a level below the first belt, and a third belt from the second intermediate member to the wrist member at a level above the first belt.

7. The method of claim 6 comprising independently moving the wrist member by driving the wrist member through a shoulder axis of the upper arm.

8. The method of claim 6 comprising independently moving the wrist member by driving the wrist member through an elbow axis of the upper arm.

9. The method of claim 6 wherein independently moving comprises placing a substrate into the at least one process chamber coupled to the vacuum transfer chamber wherein the at least one process chamber is non-focalized.

10. The method of claim 6 wherein the step of independently moving comprises placing a substrate into the at least one process chamber coupled to the vacuum transfer chamber wherein the end effector is orientated at a nonzero angle to a focal line of the at least one process chamber.

11. An electronic device processing system, comprising:
a transfer chamber;
a process chamber coupled to the transfer chamber; and
a robot apparatus positioned in the transfer chamber and adapted to transport a substrate to the process chamber, the robot apparatus including:
an upper arm having a first proximate end and a second remote end, the upper arm remotely drivable by a first motor positioned outside of the transfer chamber, the upper arm capable of independent angular rotation about a shoulder axis in an X-Y plane in both a clockwise and a counterclockwise direction, a forearm having a first proximate end and a second remote end, the first proximate end of the forearm coupled to the second remote end of the upper arm, the upper arm remotely drivable by a second motor positioned outside of the transfer chamber, the forearm is capable of independent angular rotation about an elbow axis in an X-Y plane in both a clockwise and a counterclockwise direction relative to the upper arm, and a wrist member having a first proximate end and a second remote end, the proximate end of the wrist member coupled to the remote end of the forearm, the wrist member includes an end effector adapted to carry the substrate, the wrist member and the end effector is capable of independent rotation in an X-Y plane about a wrist axis in a clockwise or a counterclockwise direction relative to the forearm, and the wrist member is remotely drivable by a third motor positioned outside the transfer chamber, wherein the first motor, the second motor, and the third motor are coupled to the upper arm, forearm and wrist member respectively via concentrically disposed shafts that extend from the respective motors, and a connector that connects a first shaft extending from the third motor to the wrist member, wherein the connector includes a first belt from the first shaft to a first intermediate member, a second belt from the first intermediate member to a second intermediate member at a level below the first belt, and a third belt from the second intermediate member to the wrist member at a level above the first belt.

* * * * *